United States Patent
Kirihata et al.

(10) Patent No.: US 6,519,174 B2
(45) Date of Patent: Feb. 11, 2003

(54) EARLY WRITE DRAM ARCHITECTURE WITH VERTICALLY FOLDED BITLINES

(75) Inventors: Toshiaki K. Kirihata, Poughkeepsie, NY (US); Sang Hoo Dhong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/859,145

(22) Filed: May 16, 2001

(65) Prior Publication Data

US 2002/0172067 A1 Nov. 21, 2002

(51) Int. Cl.$^7$ ................................................. G11C 5/06
(52) U.S. Cl. ............................. 365/69; 365/63; 365/136
(58) Field of Search .......................... 365/69, 63, 136, 365/149, 207, 190

(56) References Cited

U.S. PATENT DOCUMENTS

| | | | |
|---|---|---|---|
| 4,980,862 A | 12/1990 | Foss | 365/203 |
| 5,008,214 A | 4/1991 | Redwine | 437/52 |
| 5,093,808 A | 3/1992 | Foss | 365/203 |
| 5,276,649 A * | 1/1994 | Hoshita et al. | 365/206 |
| 5,292,678 A | 3/1994 | Dhong et al. | 437/50 |
| 5,461,589 A * | 10/1995 | Hidaka et al. | 365/208 |
| 5,550,769 A * | 8/1996 | Hidaka et al. | 365/63 |
| 5,602,772 A * | 2/1997 | Nakano et al. | 365/51 |
| 5,625,601 A | 4/1997 | Gillingham et al. | 365/220 |
| 5,636,174 A | 6/1997 | Rao | 365/230.03 |
| 5,687,132 A | 11/1997 | Rao | 365/230.03 |
| 5,787,311 A | 7/1998 | Waller | 395/869 |
| 5,877,976 A | 3/1999 | Lattimore et al. | 365/63 |
| 6,069,815 A * | 5/2000 | Muller et al. | 365/63 |
| 6,151,260 A | 11/2000 | Birk | 365/207 |
| 6,188,598 B1 * | 2/2001 | Mueller et al. | 365/69 |

* cited by examiner

Primary Examiner—David Nelms
Assistant Examiner—Thong Le
(74) Attorney, Agent, or Firm—Robert A. Walsh; Cantor Colburn LLP

(57) ABSTRACT

A memory cell system for a dynamic random access memory (DRAM) array is disclosed. In an exemplary embodiment of the invention, the system includes a plurality of data storage elements arranged in rows and columns. A plurality of wordlines corresponds to the columns, and a plurality of lower bit lines corresponds to the rows, with each of the plurality of lower bitlines further being associated with a plurality of upper, complementary bitlines thereto. The plurality of upper bitlines are vertically aligned with the plurality of lower bitlines, thereby defining a plurality of vertically folded bitline pairs. Further, a plurality of sense amplifiers are arranged in the rows, with each of said plurality of sense amplifiers having one of said plurality of vertically folded bitline pairs as inputs thereto. When one of the plurality of wordlines is activated, a subset of the rows corresponding to the vertically folded bitline pairs is activated.

26 Claims, 4 Drawing Sheets

EARLY WRITE DRAM ARCHITECTURE WITH VERTICALLY FOLDED BITLINES

BACKGROUND

The present invention relates generally to integrated circuit memory devices and, more particularly, to improving random access cycle time for Dynamic Random Access Memories (DRAMs).

The evolution of sub-micron CMOS technology has resulted in significant improvement in microprocessor speeds. Quadrupling roughly every three years, microprocessor speeds have now even exceeded 1 Ghz. Along with these advances in microprocessor technology have come more advanced software and multimedia applications, requiring larger memories for the application thereof. Accordingly, there is an increasing demand for larger Dynamic Random Access Memories (DRAMs) with higher density and performance.

DRAM architectures have evolved over the years, being driven by system requirements that necessitate larger memory capacity. However, the speed of a DRAM, characterized by its random access time (tRAC) and its random access cycle time (tRC), has not improved in a similar fashion. As a result, there is a widening speed gap between the DRAMs and the CPU, since the clock speed of the CPU steadily improves over time.

The random access cycle time (tRC) of a DRAM array is generally determined by the array time constant, which represents the amount of time to complete all of the random access operations. Such operations include: wordline activation, signal development on the bitlines, bitline sensing, signal write back, wordline deactivation and bitline precharging. Because these operations are performed sequentially in a conventional DRAM architecture, increasing the transfer speed, or bandwidth, of the DRAM becomes problematic.

BRIEF SUMMARY

The foregoing discussed drawbacks and deficiencies of the prior art are overcome or alleviated by a memory cell system for a dynamic random access memory (DRAM) array. In an exemplary embodiment of the invention, the system includes a plurality of data storage elements arranged in rows and columns. A plurality of wordlines corresponds to the columns, and a plurality of lower bit lines corresponds to the rows, with each of the plurality of lower bitlines further being associated with a plurality of upper, complementary bitlines thereto. The plurality of upper bitlines are vertically aligned with the plurality of lower bitlines, thereby defining a plurality of vertically folded bitline pairs. Further, a plurality of sense amplifiers are arranged in the rows, with each of said plurality of sense amplifiers having one of said plurality of vertically folded bitline pairs as inputs thereto. When one of the plurality of wordlines is activated, a subset of the rows corresponding to the vertically folded bitline pairs is activated.

In a preferred embodiment, when one of the plurality of wordlines is activated, only every other of the rows corresponding to the vertically folded bitline pairs is activated. In addition, the plurality of data storage elements are arranged in a non-cross point configuration with respect to the rows and columns. One group of the sense amplifiers is arranged on one side of the array, while another group of the sense amplifiers is arranged on the opposite side of the array. When one group of the sense amplifiers is activated, the other group of sense amplifiers is deactivated. Correspondingly, when the other group of sense amplifiers is activated, the one group of sense amplifiers is deactivated.

BRIEF DESCRIPTION OF THE DRAWINGS

Referring to the exemplary drawings wherein like elements are numbered alike in the several Figures.

DETAILED DESCRIPTION

Figure 1:
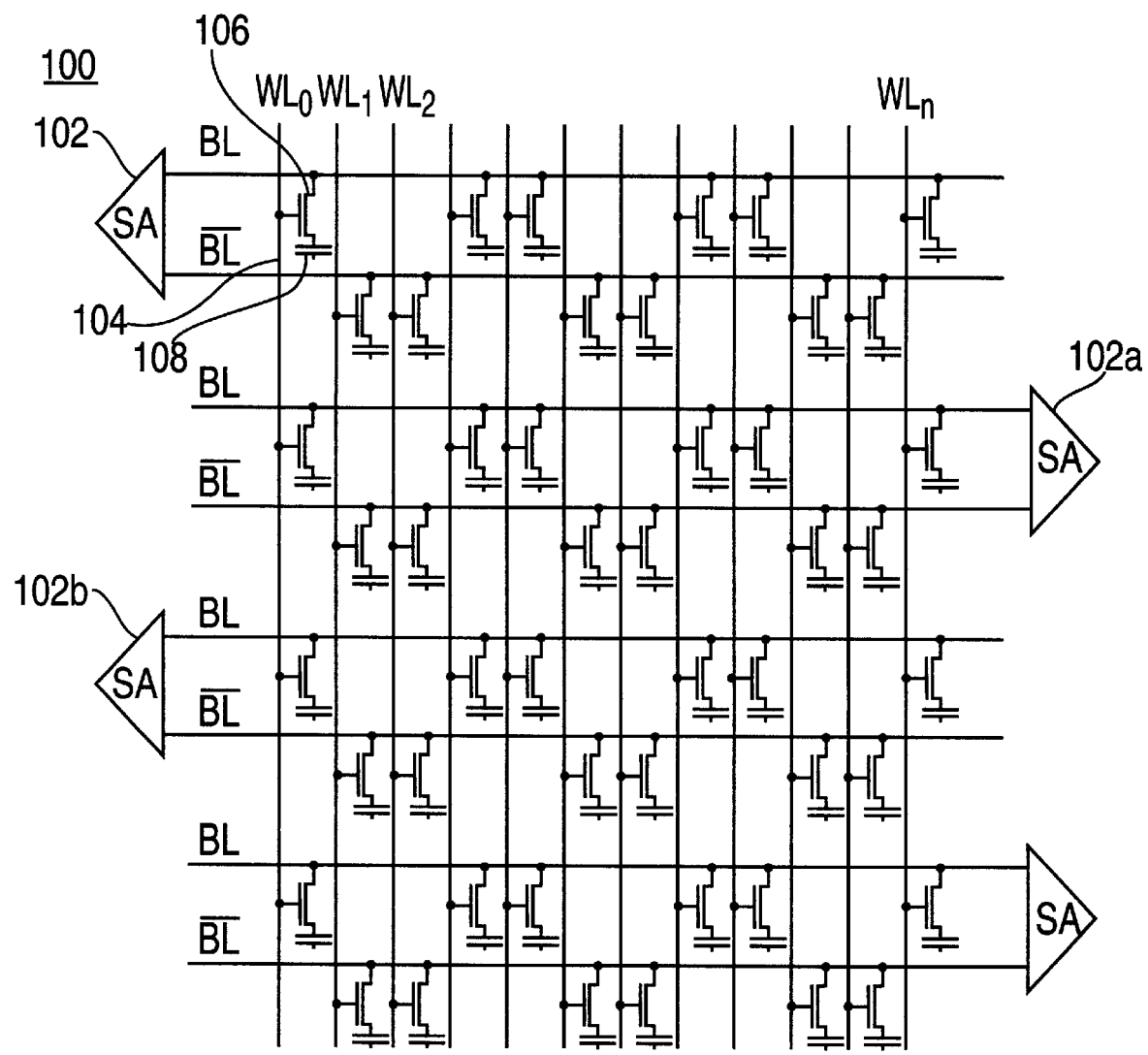
FIG. 1 is a schematic diagram of an existing folded bitline architecture for a DRAM array cell structure.

Referring initially to FIG. 1, an existing folded bitline architecture 100 for a DRAM array cell structure is illustrated. Folded bitline architectures are well known in the art and are not discussed in greater detail, except as they relate to the present invention embodiments. Architecture 100 includes a series of sense amplifiers 102, each having a horizontally disposed bitline (BL) and a complimentary bitline (BL bar) as inputs thereto. A series of wordlines ($WL_0$–$WL_n$), transversely disposed to the bitlines, cross the bitlines (BL) and complimentary bitlines (BL bar) in a grid-like pattern. A memory cell 104 is formed at the crossing point of a bitline (BL) or complementary bitline (BL bar) and a wordline. The memory cell 104 includes a field effect transistor (FET) 106 and a capacitor 108, functioning as a data storage element. In a conventional array organization, a wordline with a 2F pitch is arranged with a bitline pair with a 4F pitch, thereby resulting in a 2F×4F ($8F^2$) area per cell, with a minimum feature size of F.

Figure 2:
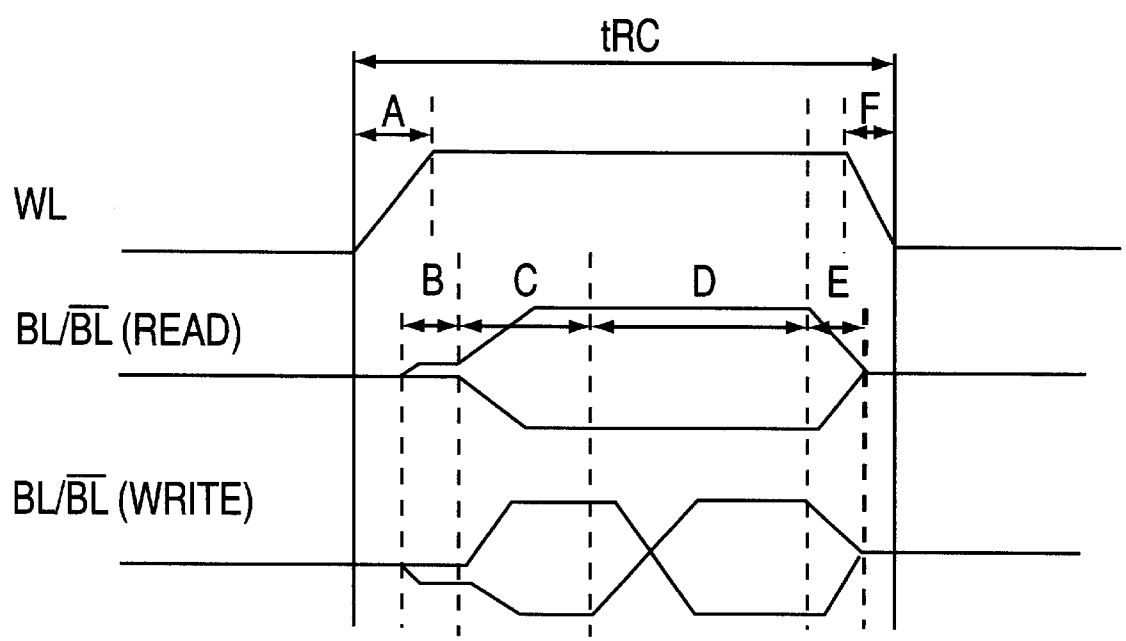
FIG. 2 is a signal timing diagram illustrating the read and write operations of the DRAM array cell structure in FIG. 1, specifically illustrating the sequential processing steps associated therewith.

The read and write operations of the conventional folded bit line architecture 100 with an $8F^2$ cell configuration are best understood with an explanation of the following sequential signal processing steps or phases, which are also graphically represented in FIG. 2:

(A) activation of a wordline (WL);
(B) signal development on the bitlines (BL and BL bar);
(C) bitline (BL) sensing;
(D) "delayed write";
(E) a bitline (BL) precharging operation; and
(F) deactivation of the wordline (WL)

(A) activation of a wordline: A read/write operation for an individual cell is enabled only when the corresponding wordline is activated, thereby turning the gate of the FET (e.g., FET 106), thereby coupling the capacitor (e.g., capacitor 108) to the bitline (BL). In the present example, the activation of $WL_0$ is discussed.

(B) signal development on the bitlines (BL and BL bar): Prior to the activation of $WL_0$, the capacitor 108 holds a data bit as a charge. The capacitor 108 holds 0 volts for a "data 0" bit, and a predetermined voltage ($V_{DD}$) for a "data 1" bit, respectively. The bitline pairs (BL and BL bar) are already precharged (e.g., at a ½ $V_{DD}$ level). Then, when $WL_0$ goes high, the capacitor 108 is coupled to the corresponding bitline (BL) through FET 106. The coupling between the capacitor 108 and the bitline (BL) causes a slight increase or decrease in the voltage of BL (depending on whether the capacitor 108 initially stored 0 volts or $V_{DD}$), while the voltage on BL bar remains at its precharged value.

(C) bitline sensing: Sense amplifier (SA) 102 amplifies the differential voltage between BL and BL bar by driving clock signals thereto low and high, respectively. The detailed operation of a CMOS cross-coupled sense amplifier is well known in the art, and is not discussed further detail hereinafter.

(D) "delayed write": After the BL signal is sufficiently amplified, the bitline pair is readied for a read or a write operation by coupling the bitline pair to a precharged data line pair (not shown). For a data read mode, a differential voltage is generated on the data line pair, which differential voltage is then sensed by another sense amplifier (not shown). Because the read operation is relatively quick, the execution time thereof is ignored hereafter for purposes of simplicity.

However, during a write mode operation, the voltages on the bitline pair may be "flipped", depending upon the data pattern driven from the data line pair. The data bit is the written back to the cell, which operation requires sufficient time. This is shown in FIG. 2 as phase D, referred to as a "delayed write". It should be pointed out that the "delayed write" mode should not be enabled prior to the completion of bitline sensing operation (C), since the bitline voltage swing in a write mode would cause a coupling noise on an adjacent bitline during signal development or bitline sensing thereon, thereby destroying the small bitline signal due the incompletion of the bitline sensing operation.

(E)/(F) bitline precharging, wordline deactivation: Finally, after data is either read from or written to the cell 104, bitline pairs are once again precharged and the wordline ($WL_0$) is deactivated, thereby isolating the data cell 104 from the bitline pair. A data bit is therefore maintained in the capacitor 108.

From the foregoing description, it may become apparent that time could be saved during a write operation if phase (D) could begin immediately following the wordline activation phase (A), simultaneously with the wordline activation phase (A), or perhaps even prior to the wordline activation phase (A). Such may be the case if it is not necessary to first read a data bit from the cell before writing thereto. It would also be the case if it were possible to enable a write mode while allowing a bitline sensing operation, without destroying data bits during a signal development or a bitline sensing operation. This would eliminate the need to wait until after the signal development (B) and bitline sensing (C) phases associated with a read operation and, therefore, reduce the overall random access cycle time (tRC) of a write operation. However, as stated earlier, an "early write" operation would interfere with a simultaneous read operation in an adjacent bit line. This is illustrated by referring once again to FIG. 1.

By way of example, it is assumed that a write operation is to be executed in one of the cells in the row of bitline pairs connected to sense amplifier 102a (row 102a). It is further assumed that, at the same time, read operations are to be executed in one of the cells for both the row of bitline pairs connected to sense amplifier 102 (row 102) and sense amplifier 102b (row 102b). If a large bitline voltage swing were in progress in row 102a for a write mode during the same time as signal development or bitline sensing in rows 102 and 102b, the resulting adjacent bitline coupling from the voltage swing would destroy the sensing signals generated in rows 102 and 102b. Thus, the bitline voltage swing in row 102a must "wait" until after the bitline signals in rows 102 and 102b are fully developed and sensed.

Figure 3:
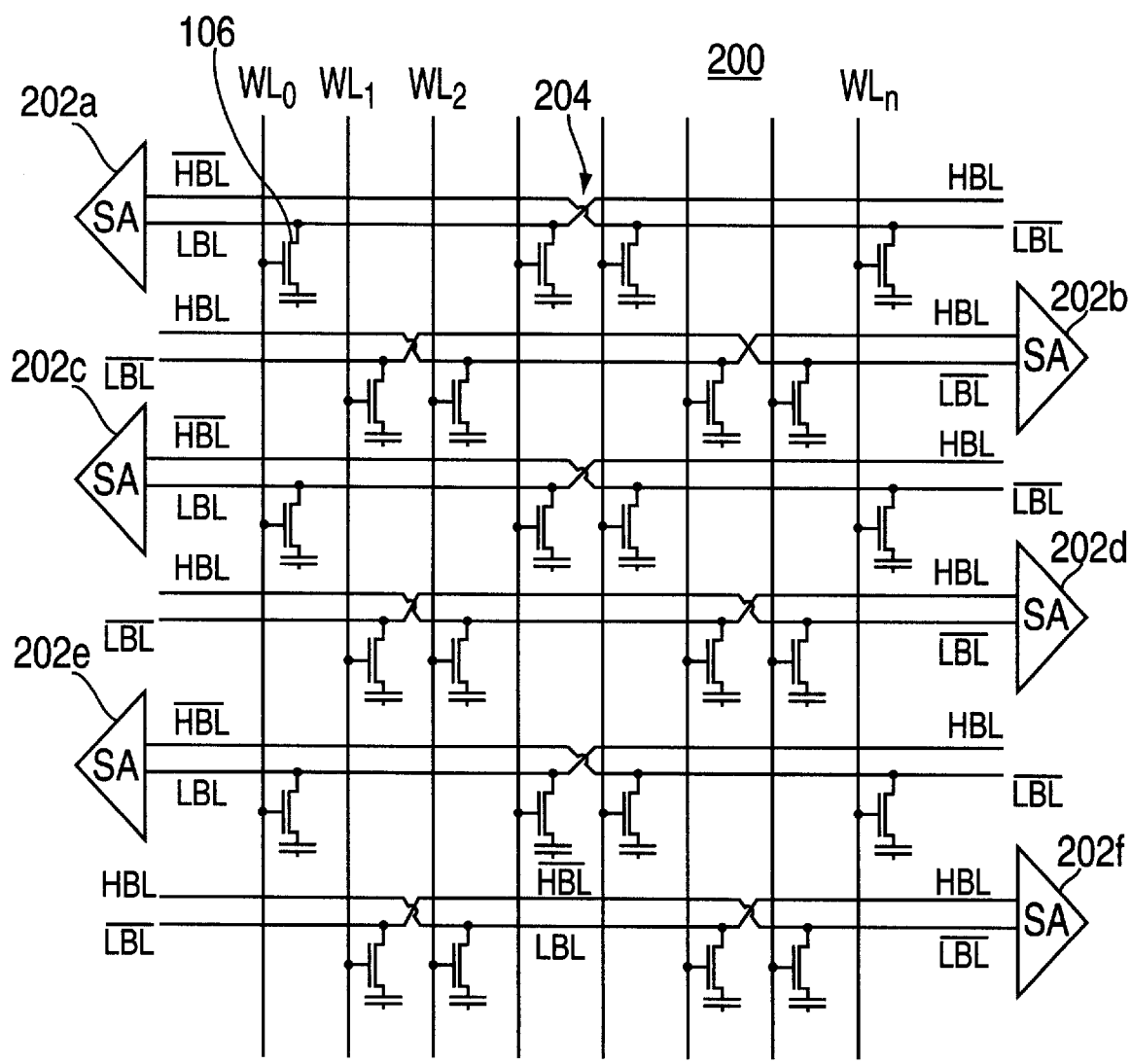
FIG. 3 is a schematic diagram of a vertically folded bitline architecture for a DRAM array cell structure, in accordance with an embodiment of the invention.

Therefore, in accordance with an embodiment of the invention, a memory cell system having a vertically folded bitline architecture 200, which system enables an early write operation, is disclosed in FIG. 3. As with a conventional folded bitline architecture, architecture 200 features a plurality of cells having a wordline with a 2F pitch and a bitline pair with a 4F pitch, resulting in a 2F×4F ($8F^2$) area per cell with a minimum feature size of F. Alternatively, a greater than 2F wordline pitch or a greater than 4F bitline pair pitch may be used, so long as the cell positioning is logically the same as shown in FIG. 3.

Each sense amplifier (202a–f) shown in FIG. 3 has a pair of vertically oriented bitlines as inputs thereto. However, unlike the architecture 100 of FIG. 1, an adjacent compliment of a given bitline is not connected to the same sense amplifer as is the bitline. Rather, the complementary bitline is connected to a different sense amplifier on the opposite side of the array.

For example, sense amplifier 202a is connected to a bitline designated LBL. Hereinafter, the designation "L" preceding a bitline (BL) or a complementary bitline (BL bar) means that the bitline or its compliment is located at a lower or local level with respect to the amplifier. The designation "H" preceding a bitline (BL) or a complementary bitline (BL bar) means that the bitline or its compliment is located at an upper or hierarchical level with respect to the local level and the amplifier. Ordinarily, sense amplifier 202a would also be connected to the LBL bar immediately adjacent LBL in the lower level. However, in the present configuration, an upper level complementary bit line (HBL bar) is connected to sense amplifier 202a in order to provide a differential signal. Furthermore, LBL bar is used as an input to sense amplifier 202b, along with HBL, to form another vertically oriented pair of bitlines.

In this vertically folded bitline arrangement, it is seen that each column (wordline) is divided into a plurality of local bitlines (LBLs) at a lower metal level. The hierarchical bitlines (HBL bars), located at an upper metal level, are arranged over the lower metal level LBLs. The LBLs are coupled to the corresponding HBLs by periodic twisting, as indicated by twists 204. The number and location of twisting positions in this embodiment may be arbitrary so long as the total number of the LBLs and HBLs coupled to a corresponding sense amplifier is the same. Because of the nature of the bitline sensing in architecture 200, having the same capacitance for a bitline pair is important. However, the actual twisting location may be the same or different for any given bitline pairs.

The cell configuration of architecture 200 (as with architecture 100) is still a non-cross point configuration. However, it will be noted that when a given wordline is activated, only every other sense amplifier is activated by a bitline coupling to a DRAM cell. For example, when wordline $WL_0$ is activated for the conventional array in FIG. 1, each sense amplifier 102 is active, since each amplifier has a cell connected thereto which is also connected to $WL_0$. On the other hand, when wordline $WL_0$ is activated for the array in FIG. 3, only the sense amplifiers located on the left side of the array (202a, 202c, 202e) are activated by a bitline coupling. The sense amplifiers located on the right side of the array (202b, 202d, 202f) remain inactive, and the corresponding bitlines remain in a precharged state, since they are not connected to a cell which is also connected to $WL_0$. Conversely, if $WL_1$ is activated, only the sense amplifiers located on the right side of the array (202b, 202d, 202f) are activated by a bitline coupling, while the sense amplifiers located on the right side of the array (202b, 202d, 202f) remain inactive, with the corresponding bitlines remaining in a precharged state.

It will therefore be appreciated that because one set of sense amplifiers remains deactivated, along with the pair of vertically folded bitlines connected thereto, those inactive (and precharged) bitlines may serve as signal shielding for a horizontally adjacent bitline which is active. This effect is illustrated by further reference to FIG. 3. It will now be assumed that a write operation is to take place in one of the cells coupled to sense amplifier 202c, while a read operation takes place in cells coupled to sense amplifiers 202a and 202e (from the same wordline as the cell coupled to sense amplifier 202c). It is further assumed that a flipping operation, and hence a bitline swing, takes place on LBL (and HBL bar) connected to sense amplifier 202c. Ordinarily, the bitline swing would be delayed until the signal development and bitline sensing on the adjacent bitlines is completed. However, such a restriction may now be bypassed.

The bitline swing on bitline LBL (and HBL bar) connected to sense amplifier 202c is shielded on either side by the LBL bar (and HBL) bitlines connected to sense amplifiers 202b and 202d. As a result, the bitline swing may occur at the same time as the signal development and bitline sensing on the LBL (and HBL bar) bitlines connected to sense amplifiers 202a and 202e, without destroying the sensed signals. In other words, due to the above described bitline shielding features, data to be written and data to be read may be simultaneously amplified and written back to the corresponding cells when the sense amplifier has been activated.

Thus configured, architecture 200 allows for an "early write" operation by providing shielding bitlines between each activated bitline. Therefore, a bitline swing for a write operation may commence as soon as the appropriate wordline is activated, simultaneously with the wordline activation, or even prior to wordline activation, since an inactive vertical bitline pair on either side of the active vertical bitline pair prevents signal coupling between active vertical bitline pairs.

Alternatively, each of the sense amplifiers 202a–f may be physically arranged on the same side of the array, so long as only one of the sense amplifier groups (202a, 202c, 202e) or (202b, 202d, 202f) are activated, and the bitlines connected to the other group of amplifiers are used for bitline shielding. As yet another alternative, certain individual bitlines may be shielded through the use of the present configuration, while the remaining bitlines are conventionally configured in a folded bitline architecture.

Figure 4:
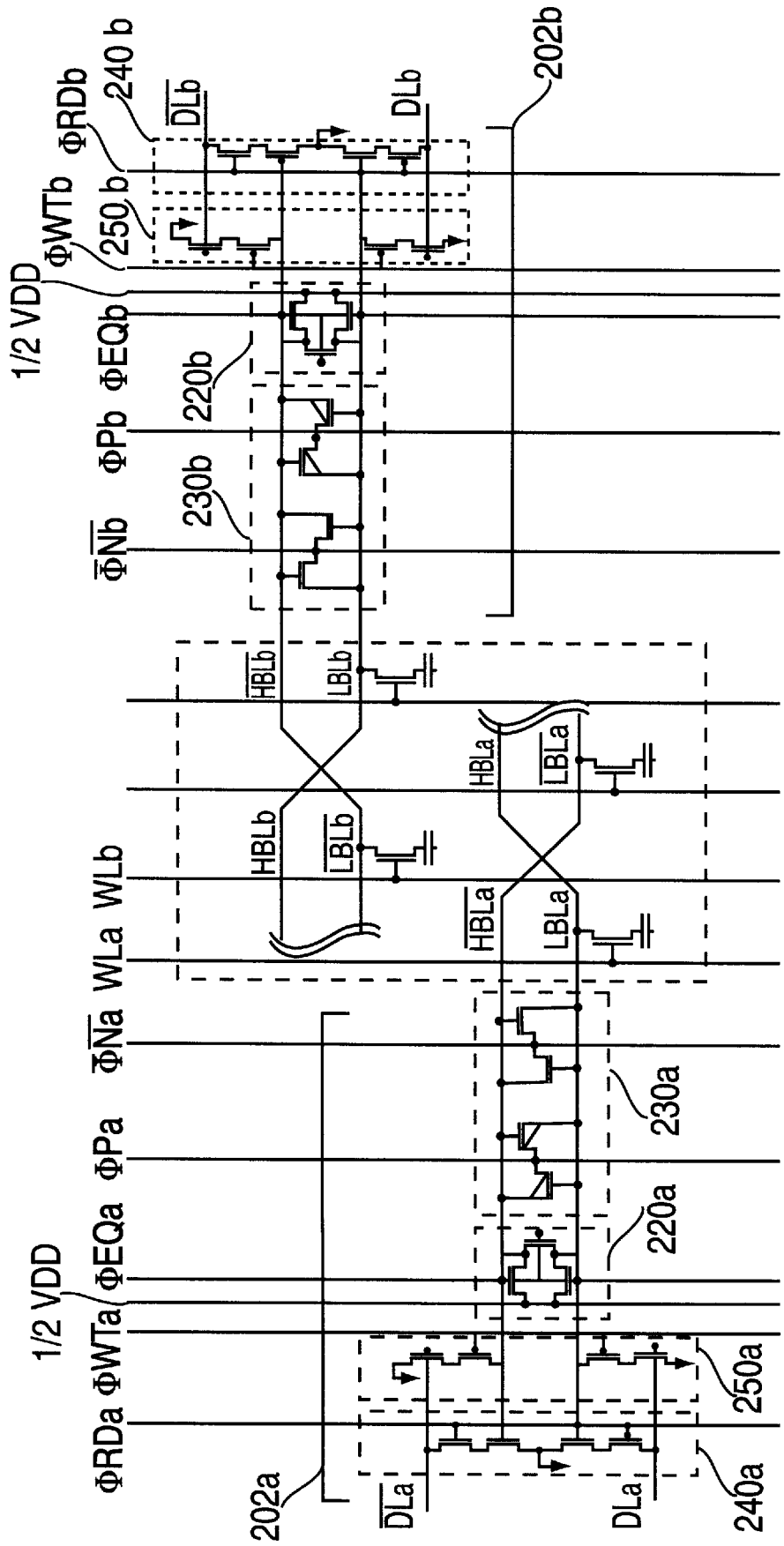
FIG. 4 is a transistor level schematic diagram illustrating the operation of two of the sense amplifiers in FIG. 3, positioned on opposite sides of the DRAM array.

Finally, FIG. 4 is a transistor level schematic diagram illustrating the operation of two of the sense amplifiers (202a and 202b) shown in FIG. 3. Each sense amplifier 202a, 202b includes CMOS cross-coupled devices 230, a bitline precharging device 220, a read column switch 240 and a write column switch 250. (It will be noted that the aforementioned reference numerals are shown with the suffix "a" or "b" in FIG. 4, corresponding to a particular sense amplifer 202a, 202b associated therewith.) As mentioned previously, the sense amplifiers 202a and 202b are arranged on opposite sides of the array, supporting corresponding vertical bitline pairs (HBLa and LBLa for sense amplifier 202a, and HBLb and LBLb for sense amplifier 202b).

In a standby state, the signal ΦEQa is high, precharging the vertically twisted bitlines HBLa and LBLa at a ½ $V_{DD}$ voltage, where $V_{DD}$ is a power source voltage. The sense signals ΦNa bar and ΦPa remain low and high, respectively, disabling CMOS cross-coupled devices 230a. Signals ΦRDa and ΦWTa remain low, disabling read and write column switches 240a and 250a. Similarly, in a standby state, the signal ΦEQb is high, precharging the vertically twisted bitlines HBLb and LBLb at ½ $V_{DD}$. The sense signals ΦNb bar and ΦPb remain low and high, respectively, disabling CMOS cross-coupled devices 230b. Signals ΦRDb and ΦWTb remain low, disabling read and write column switches 240b and 250b. The delayed read and write operation will be understood as follows:

Read Mode—WLa

Prior to the WLa activation, ΦEQa goes low in order to disable a bitline precharge operation. Therefore, the signal in the cell is transferred to sense amplifier 202a through LBLa and HBLa when the WLa is activated. It should be noted that the voltages LBLa bar and HBLa bar are kept as they are. This then generates a small differential voltage between the HBL and LBL pair. The signals ΦNa bar and ΦPa go low and high, respectively, thus amplifying the differential signal. The data bits are then read by activating ΦRDa in order to couple the bitlines to data lines DLa and DLa bar. The activation of ΦRDa may take place immediately after the wordline operation, as CMOS cross-coupled devices 230a are not essential for reading data. This direct sensing approach is well known in the art and is not discussed in further detail.

During a sensing operation with sense amplifier 202a, sense amplifier 202b remains in a standby state, where ΦEQb, ΦNb bar, ΦPb, ΦRDb and ΦWTb are maintained at high, high, low, low and low, respectively. Therefore, the bitlines HBLb and LBLb remain at ½ $V_{DD}$, thereby shielding bitlines HBLa and LBLa. Further, in a precharge state, WLa is discharged while ΦNa bar and ΦPa go high and low, respectively. Finally, ΦEQa goes high, precharging HBLa and LBLa at the ½ $V_{DD}$ level.

Early Write Mode—WLa

Prior to the activation of WLa, the signal ΦEQa goes low in order to disable a bitline precharge operation. Simultaneously to (or even prior to) the wordline WLa activation, ΦWTa goes high, writing a data bit to the corresponding bitlines LBLa and HBLa. During this phase, other bitlines may be in a signal development phase or a sensing phase. The signals ΦNa bar and ΦPa go low and high, amplifying the differential signal, similar to the read mode. Again, during a sensing operation with sense amplifier 202a, sense amplifier 202b remains in a standby state, where ΦEQb, ΦNb bar, ΦPb, ΦRDb and ΦWTb are maintained at high, high, low, low and low, respectively. Therefore, bitlines HBLb and LBLb remain at ½ $V_{DD}$, shielding bitlines HBLa and LBLa, even if other bitlines having a large voltage swing thereon during a write mode. Once again, in a precharge state, WLa is discharged while ΦNa bar and ΦPa go high and low, respectively. Then, ΦEQa goes high, precharging HBLa and LBLa at the ½ $V_{DD}$ level.

From the foregoing description, it will be seen that as a result of the bitline shielding by utilizing precharged bitlines, an early write operation is realized without destroying another data bit during signal development or a sensing operation for other bitlines. Furthermore, as discussed previously, the sense amplifiers may all be physically located on the same side of an array, so long as the control signal protocol described above is followed.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A memory cell system for a dynamic random access memory (DRAM) array, comprising:
   a plurality of data storage elements arranged in rows and columns;
   a plurality of wordlines, corresponding to said columns;
   a plurality of lower bitlines, corresponding to said rows, each of said plurality of lower bitlines further being associated with a plurality of upper, complementary bitlines thereto;
   said plurality of upper bitlines being vertically aligned with said plurality of lower bitlines, thereby defining a plurality of vertically folded bitline pairs; and
   a plurality of sense amplifiers, arranged in said rows, each of said plurality of sense amplifiers having one of said plurality of vertically folded bitline pairs as inputs thereto;
   wherein, when one of said plurality of wordlines is activated, a subset of said vertically folded bitline pairs is activated.

2. The memory cell system of claim 1, wherein when one of said plurality of wordlines is activated, only every other of said vertically folded bitline pairs is activated.

3. The memory cell system of claim 1, wherein said vertically folded bitline pairs are formed by vertically twisting said lower and upper bitlines.

4. The memory cell system of claim 3, wherein said vertically folded bitline pairs are formed at arbitrary points along said rows.

5. The memory cell system of claim 3, wherein said vertically folded bitline pairs formed in one row of said rows are located at different points than said vertically folded bitline pairs formed in an adjacent row of said rows.

6. The memory cell system of claim 3, wherein said vertically folded bitline pairs formed in one row of said rows are located the same points as said vertically folded bitline pairs formed in an adjacent row of said rows.

7. The memory cell system of claim 3, wherein a total number of lower bitlines and upper bitlines coupled to a corresponding sense amplifier is the same.

8. The memory cell system of claim 3, wherein the total number of lower bitlines and upper bitlines coupled to one of said plurality of sense amplifiers is the same as the total number of lower bitlines and upper bitlines coupled to an adjacent one of said plurality of sense amplifiers.

9. The memory cell system of claim 3, wherein the total number of lower bitlines and upper bitlines coupled to one of said plurality of sense amplifiers is different than the total number of lower bitlines and upper bitlines coupled to an adjacent one of said plurality of sense amplifiers.

10. The memory cell system of claim 1, wherein said plurality of data storage elements are arranged in a non-cross point configuration with respect to said rows and columns.

11. The memory cell system of claim 1, wherein said plurality of data storage elements are arranged within an $8F^2$ cell configuration.

12. The memory cell system of claim 1, further comprising:
    one group of said sense amplifiers, arranged on one side of the array; and
    another group of said sense amplifiers, arranged on the opposite side of the array.

13. The memory cell system of claim 12, wherein:
    when said one group of said sense amplifiers is activated, said another group of sense amplifiers is deactivated; and
    when said another group of sense amplifiers is activated, said one group of sense amplifiers is deactivated.

14. A method for electrically shielding a plurality of bitlines in a dynamic random access memory (DRAM) array, the method comprising:
    arranging a plurality of data storage elements in rows and columns;
    configuring a plurality of wordlines, corresponding to said columns;
    configuring a plurality of lower bitlines, corresponding to said rows, each of said plurality of lower bitlines further being associated with a plurality of upper, complementary bitlines thereto;
    said plurality of upper bitlines being vertically aligned with said plurality of lower bitlines, thereby defining a plurality of vertically folded bitline pairs; and arranging a plurality of sense amplifiers in said rows, each of said plurality of sense amplifiers having one of said plurality of vertically folded bitline pairs as inputs thereto;

wherein, when one of said plurality of wordlines is activated, a subset of said vertically folded bitline pairs is activated.

15. The method of claim 14 wherein, when one of said plurality of wordlines is activated, only every other of said vertically folded bitline pairs is activated.

16. The method of claim 13, wherein said vertically folded bitline pairs are formed by vertically twisting said lower and upper bitlines.

17. The method of claim 16, wherein said vertically folded bitline pairs are formed at arbitrary points along said rows.

18. The method of claim 16, wherein said vertically folded bitline pairs formed in one row of said rows are located at different points than said vertically folded bitline pairs formed in an adjacent row of said rows.

19. The method of claim 16, wherein said vertically folded bitline pairs formed in one row of said rows are located the same points as said vertically folded bitline pairs formed in an adjacent row of said rows.

20. The method of claim 16, wherein a total number of lower bitlines and upper bitlines coupled to a corresponding sense amplifier is the same.

21. The method of claim 16, wherein the total number of lower bitlines and upper bitlines coupled to one of said plurality of sense amplifiers is the same as the total number of lower bitlines and upper bitlines coupled to an adjacent one of said plurality of sense amplifiers.

22. The method of claim 16, wherein the total number of lower bitlines and upper bitlines coupled to one of said plurality of sense amplifiers is different than the total number of lower bitlines and upper bitlines coupled to an adjacent one of said plurality of sense amplifiers.

23. The method of claim 14, wherein said plurality of data storage elements are arranged in a non-cross point configuration with respect to said rows and columns.

24. The method of claim 16, wherein said plurality of data storage elements are arranged within an $8F^2$ cell configuration.

25. The method of claim 14, further comprising:

arranging one group of said sense amplifiers on one side of the array; and arranging another group of said sense amplifiers on the opposite side of the array.

26. The method of claim 25, wherein:

when said one group of said sense amplifiers is activated, said another group of sense amplifiers is deactivated; and when said another group of sense amplifiers is activated, said one group of sense amplifiers is deactivated.

* * * * *